United States Patent [19]
Hsu

[11] Patent Number: 5,633,187
[45] Date of Patent: May 27, 1997

[54] PROCESS FOR FABRICATING READ-ONLY MEMORY CELLS

[75] Inventor: Chen-Chung Hsu, Taichung, Taiwan

[73] Assignee: United Microelectronics Corporation, Hsinchu, Taiwan

[21] Appl. No.: 532,305

[22] Filed: Sep. 22, 1995

[51] Int. Cl.$^6$ .......................... H01L 21/265; H01L 21/70; H01L 27/00; H01L 21/44

[52] U.S. Cl. .......................... 438/275; 438/130; 438/586; 438/587

[58] Field of Search .................. 437/43, 47, 52, 437/48, 200

[56] References Cited

U.S. PATENT DOCUMENTS

| | | | |
|---|---|---|---|
| 4,143,390 | 3/1979 | Noguchi | 437/48 |
| 4,849,369 | 7/1989 | Jeuch et al. | 437/48 |
| 5,504,030 | 4/1996 | Chung et al. | 437/48 |

*Primary Examiner*—John Niebling
*Assistant Examiner*—Brian K. Dutton
*Attorney, Agent, or Firm*—Cushman Darby & Cushman, IP Group of Pillsbury Madison & Sutro, LLP

[57] ABSTRACT

A process for fabricating memory cells of a read-only memory (ROM) device is disclosed. First, a gate oxide layer, a first polysilicon layer, and a first silicide layer are formed subsequently on the surface of a silicon substrate. The layers are patterned to form parallel strip-shaped configurations extending along a first direction on the surface of the silicon substrate. Next, impurities are implanted into the surface of the substrate in the areas between the strip-shaped configurations thereby constituting buried bit lines of the memory cells. Sidewall spacers are then formed on the sidewalls of the strip-shaped configurations. A second silicide layer is then formed over the exposed surface of the buried bit lines in a self-aligned process, thereby improving the electrical conductivity of the buried bit lines. After that, the portions of the second silicide layer and the first polysilicon layer covering the coding region of the memory cells are removed. A thick insulating layer is then formed to cover the entire substrate surface. The surface of the thick insulating layer is then polished to an extent revealing the surface of the first polysilicon. Finally, a second polysilicon layer is formed on the substrate covering the surface of the thick insulating layer and the exposed first polysilicon layer. An etching procedure is then performed to form parallel strip-shaped word lines in the second polysilicon layer that extend in a second direction on the plane of the substrate, with the second direction substantially orthogonal to the first direction. Portions of the first polysilicon not covered by the word lines are also removed in the etching procedure.

17 Claims, 3 Drawing Sheets

PROCESS FOR FABRICATING READ-ONLY MEMORY CELLS

BACKGROUND OF THE INVENTION

1. Field of the Invention

The present invention relates in general to a process for fabricating semiconductor devices. In particular, the present invention relates to a process for fabricating semiconductor read-only memory cells by employing a polysilicon double-layer configuration for word lines.

2. Description of Related Art

As the technology of semiconductor fabrication advances, the integration density of memory cells of read-only memory (ROM) devices is increasing. More and more memory cells are squeezed into the same semiconductor die surface. The memory cell configuration of ROM devices have evolved several generations, beginning with the traditional two-state memory cells through the x-cell configuration, to the flat cell and modified flat cell configurations.

Conventional ROM device memory cells use channel transistors as the electric charge storage components, which are selectively implanted with impurities into the designated channel regions in the process of data programming. The purpose of this selective impurity implantation is to change the threshold voltage of those "programmed" memory cells, so that the memory cell transistor may be controlled in either the ON or OFF state to represent the binary bits one and zero respectively, or zero and one respectively depending on the memory cell supporting logic design.

A brief examination of the specifics of a conventional ROM device helps to explain the present invention. FIG. 1 (PRIOR ART) of the accompanying drawing shows the top view of a conventional ROM device which exhibits the configuration of several memory cells as observed from above. A cross-sectional view of the conventional ROM device memory cells taken along the II—II line is shown in FIG. 2 (PRIOR ART) and provides the details of the cells in another perspective.

As is shown in the drawing, a number of memory cells of the conventional ROM device are fabricated on a silicon substrate 10 of, for example, P-type. $N^+$ source/drain regions (which become bit lines 14) are formed in the designated locations of the silicon substrate 10. The top view of FIG. 1 (PRIOR ART) clearly shows that the $N^+$ source/drain regions (which become bit lines 14) are formed as long strips extending in one direction, namely, the vertical direction in the drawing which serve as the bit lines for the memory cells of the ROM device. A gate oxide layer 12 is then formed over the surface of the silicon substrate 10, and on top of which, gate electrodes (which become word lines 16) are formed to constitute the word lines for the memory cells in the ROM device. The word lines 16 are, as is shown in the top view of FIG. 1 (PRIOR ART), also formed as long strips that extend in the direction substantially orthogonal to the extending direction of the bit lines 14. In this example, the word lines 16 extend in the horizontal direction in FIG. 1 (PRIOR ART). Channel regions 18 for the memory cell transistors are formed between every two consecutive bit lines 14 and under each word line 16. The status of either conducting or blocking of each of the memory cell transistors determines its memory content as either binary one or zero (or either zero or one) respectively.

A ROM device having the basic memory cells as described above has all the memory cell transistors turned on, or, in other words, in their conducting state unless they have been programmed with data. To turn off a selected memory cell transistor, its channel region 18 would have to be implanted with P-type impurities. The process of programming the data bits into the selected memory cells of the ROM device is a process referred to as code implantation. Those memory cell transistors with their channel regions implanted with P-type impurities will have increased threshold voltage in the channel region.

However, such ROM devices having the memory cell configuration as described above have at least two disadvantages. Due to the need to reduce the size of virtually every dimension in the device as the ROM is increasingly miniaturized, it is inevitable that the width of the word lines for the memory cells is also reduced. Reduced-width word lines 16 represent increased electrical resistance over the cross section; and, increased electrical resistance directly translates into reduced memory access speed. Code implantation is a relatively inaccurate procedure considering that the dimensions of the memory cell transistor are reduced. Excessive diffusion of the implants in the designated channel region, as well as implantation location shifting constitute the primary problems of these conventional ROM devices. The typical operating characteristics exhibited by such faulty memory cells include typical electric current leakage, or a reduction of the breakdown voltage.

SUMMARY OF THE INVENTION

It is therefore an object of the present invention to provide a process for fabricating ROM device memory cells having reduced bit line electrical resistance to improve the device access speed.

It is another object of the present invention to provide a process for fabricating memory cells of a ROM device that requires no ion implantation procedure in programming the ROM device to avoid the phenomenon of implantation diffusion and misalignment, as well as premature voltage breakdown.

The present invention achieves the above-identified objects by providing a process for fabricating memory cells of a read-only memory (ROM) device. The process comprises the steps of forming a gate oxide layer, a first polysilicon layer, and a first silicide layer subsequently on the surface of a silicon substrate. The stacked layers of gate oxide, first polysilicon and first silicide are then formed into parallel strip-shaped configurations extending along a first direction along the surface of the silicon substrate. The strip-shaped stacked layers are then utilized as the masks for implementing an ion implantation procedure. Impurities are implanted into the surface of the substrate in the area between the strip-shaped configurations thereby constituting buried bit lines of the memory cells. Sidewall spacers are then formed on the sidewalls of the strip-shaped configurations. A second silicide layer is then formed over the exposed surface of the buried bit lines in a self-aligned process, thereby improving the electrical conductivity of the buried bit lines. The portions of the second silicide layer and the first polysilicon layer covering the coding region of the memory cells are then removed. A thick insulating layer is then formed to cover the entire substrate surface. The surface of the thick insulating layer is then polished to an extent revealing the surface of the first polysilicon. A second polysilicon layer is then formed on the substrate covering the surface of the thick insulating layer and the exposed first polysilicon layer. Etching is then carried out to form parallel strip-shaped word lines in the second polysilicon layer that extend in a second direction on the plane of the substrate, with the second direction substantially orthogonal to the first direction, and portions of the first polysilicon not covered by the word lines also being removed in the etching procedure.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DETAILED DESCRIPTION OF THE PREFERRED EMBODIMENT

Figure 4A:
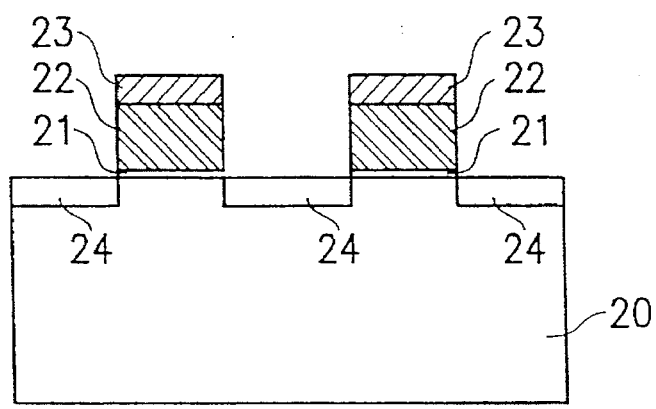
FIGS. 4A–4E are cross-sectional views taken along the IV—IV line of FIG. 3 in the selected stages of the process of their fabrication in accordance with the preferred embodiment of the present invention.

First, as shown in FIG. 4A, a semiconductor substrate, for example, a P-type silicon substrate 20 is provided for the fabrication of the ROM device of the present invention. A gate oxide layer 21 is formed over the surface of the P-type silicon substrate 20 by performing, for example, a thermal oxidation procedure, or a chemical vapor deposition (CVD) procedure, achieving a thickness of about 50 to 200 angstroms. A first polysilicon layer 22 is further formed on the surface of the gate oxide layer 21 by, for example, performing a CVD procedure, achieving a thickness of about 2,000 to 5,000 angstroms. In a similar manner, another layer of silicide, for example, Tungsten silicide layer 23 is further formed on top of the first polysilicon layer 22, to a thickness of about 500 to 1,000 angstroms.

A procedure involving the use of photolithography is then employed to define the pattern and remove the undesired portions of all the gate oxide layer 21, the first polysilicon layer 22 and the silicide layer 23, thereby forming a multiple strip-shaped configuration as shown in the cross-sectional view of FIG. 4A, which shows the cross section in a plane orthogonal to the longitudinal axis of the strip-shaped configuration.

Then, the strips remaining on the surface of the P-type silicon substrate 20 are utilized as the masks for an ion implantation procedure that brings impurities, for example, arsenic ions into the controlled depth of the substrate 20. This forms the buried bit lines 24 in the substrate 20 between every two consecutive strip-shaped configurations. The ion implantation procedure was performed at an energy level of about 50 to 100 KeV, with a dosage of about $10^{14}$ to $10^{16}$ atoms/cm$^2$.

Figure 4B:
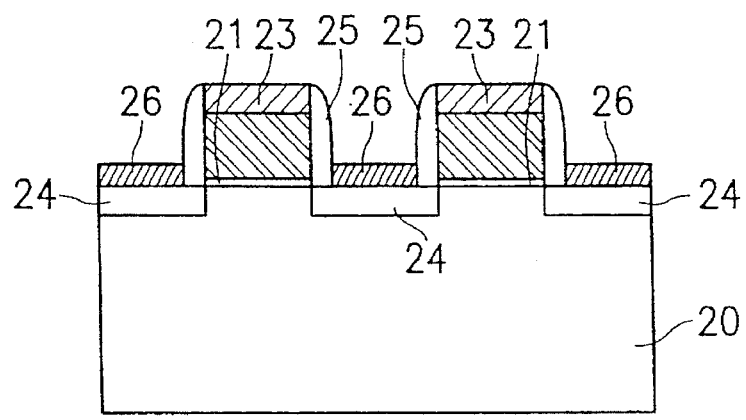

Referring next to FIG. 4B, sidewall spacers 25 are then formed on the sidewalls of the strip-shaped configuration that includes the gate oxide layer 21, the first polysilicon layer 22 and the silicide layer 23. The sidewall spacers 25 may be formed by, for example, depositing a layer of silicon dioxide and then performing a reactive ion etching (RIE) procedure to etch back the deposited silicon dioxide layer. The result is the formation of the silicon dioxide sidewall spacer 25, as is shown in FIG. 4B.

Another silicide layer, for example, titanium silicide layer 26 is then formed to cover the surface of the buried bit lines 24 in a self-aligned procedure, so as to improve the electrical conductivity thereof. This may be achieved by, for example, performing a sputtering procedure to deposit a layer of titanium to a thickness of about 300 to 800 angstroms over the surface of the tungsten silicide layer 23, as well as the surface of both the sidewall spacer 25 and the buried bit lines 24. Then, an annealing procedure implemented at a temperature of about 600° to 900° C. allows the surface of the buried bit lines 24 to react with the titanium layer, thereby forming the titanium silicide layer 26. Only a portion of the thickness of the sputtered titanium layer covering the surface of the exposed buried bit lines 24 reacts to form the titanium silicide layer during the annealing process. After the formation of the titanium silicide layer 26, all those portions of the pure titanium layer are then removed.

Figure 4C:
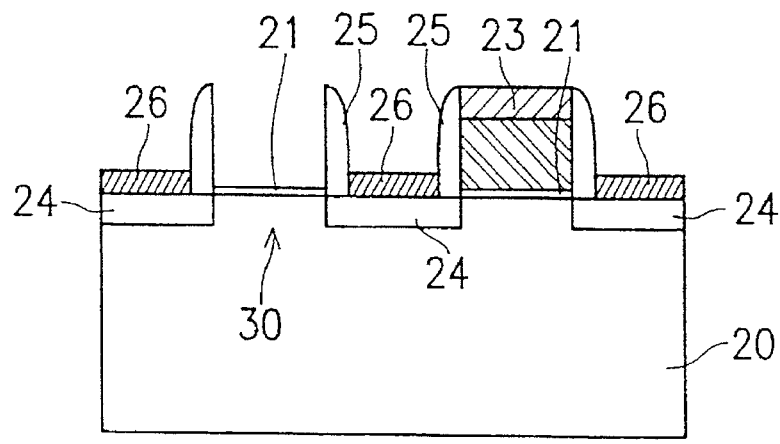

Referring next to FIG. 4C, a photoresist layer (not shown in the drawing) is formed over the surface of the substrate 20 at this stage. The coverage of the pattern formed in the photoresist reveals the coding region 30 for those memory cell transistors to be programmed as an OFF transistor. The photoresist layer may then be utilized as the mask for an etching procedure that removes the tungsten silicide layer 23 and the first polysilicon layer 22. Afterwards, the photoresist layer is then removed. This achieves a configuration such as is schematically shown in FIG. 4C. The coding region 30 of those memory cell transistors to be programmed has its gate oxide layer 21 exposed, while those not to be programmed remain shielded by the first polysilicon layer 22 and the tungsten silicide layer 23.

Figure 4D:
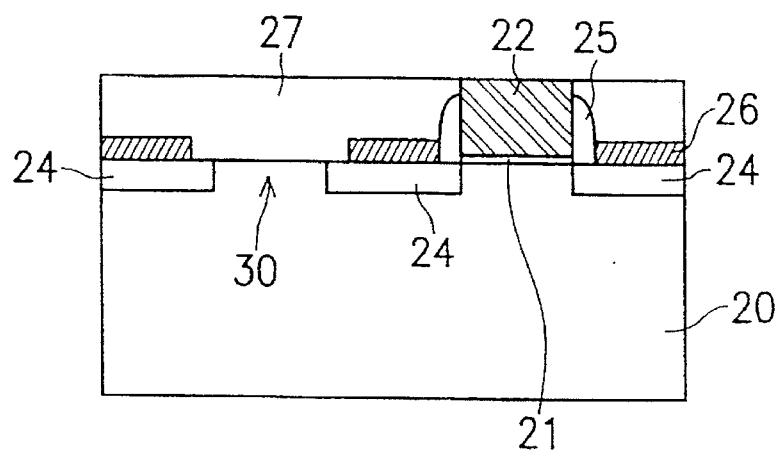

Then, as shown in FIG. 4D, a thick layer of insulator 27 such as a silicon dioxide layer with a thickness of about 5,000 angstroms is then formed to fill and cover the surface of the above mentioned layers including the coding region 30. A chemical mechanical polishing (CMP) procedure, for example, may then be implemented to polish the surface of the thick insulating layer 27 and the exposed tungsten silicide layer 23, until the surface of the first polysilicon layer 22 is revealed, as is shown in FIG. 4D.

Figure 4E:
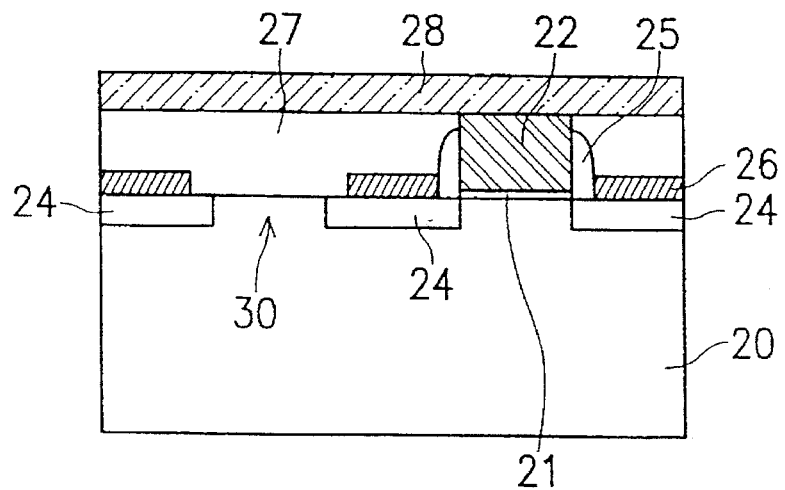

Referring to FIG. 4E, a second polysilicon layer (which becomes word lines 28) is then formed on the entire surface of the substrate construction at this stage, covering both the surfaces of the polished insulating layer 27 and the first polysilicon layer 22. The thickness of this second polysilicon layer is about 2,000 to 5,000 angstroms. A photolithography procedure, for example, may then be employed to define the pattern of the second polysilicon layer to construct a number of parallel and strip-shaped word lines 28 that extend along a direction over the plane of the substrate 20 that is orthogonal to the direction of the bit lines 24. All those first polysilicon layers 22 not covered by the pattern of the second polysilicon layer (word lines 28) are removed in the photolithography procedure as well.

This generally concludes the process of fabrication of the memory cells for the ROM device of the present invention, with the memory contents programmed. A comparative inspection of the top view of FIG. 3 with the cross-sectional view of FIG. 4E shows that the intersecting area of a word line 28 and a pair of consecutive buried bit lines 24 is the location for a memory cell of the ROM device of the present invention, as is identified by the phantom lines in the top view of FIG. 3.

Figure 1:
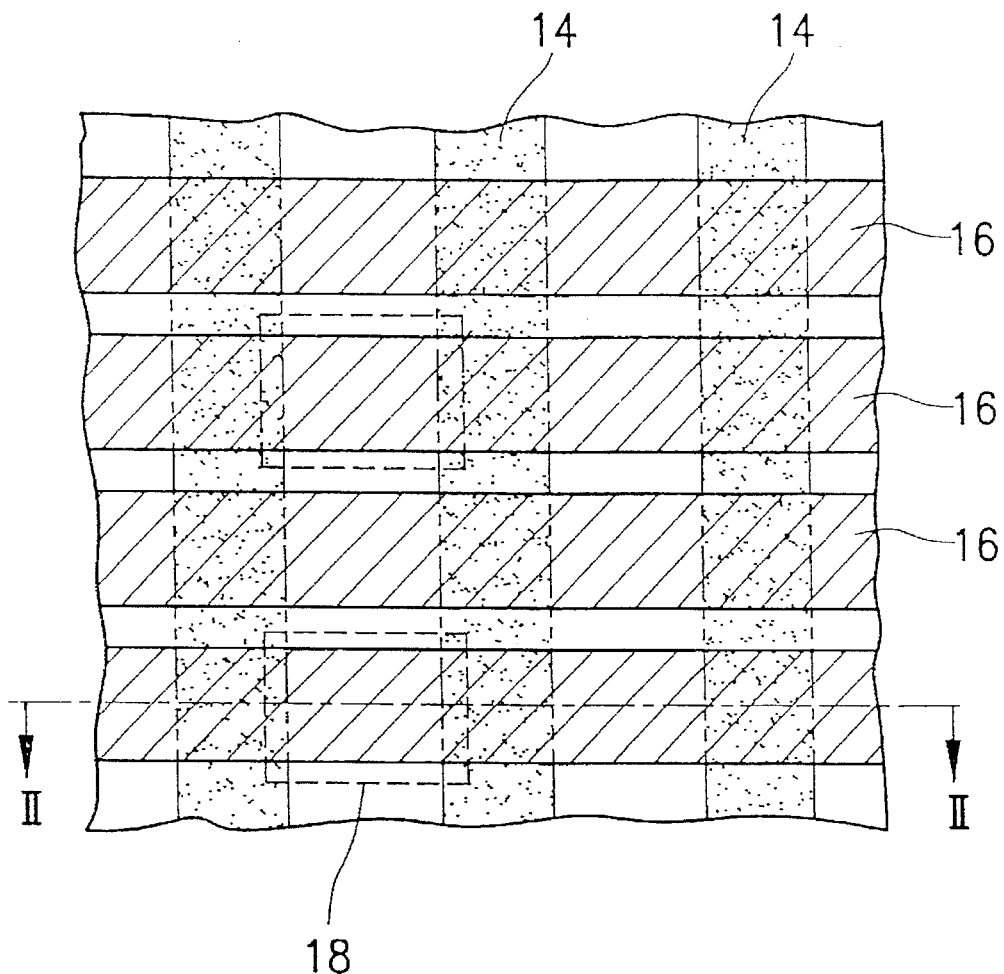
FIG. 1 (PRIOR ART) is a top view of a conventional ROM device showing the configuration of the memory cells as observed from above.
Figure 2:
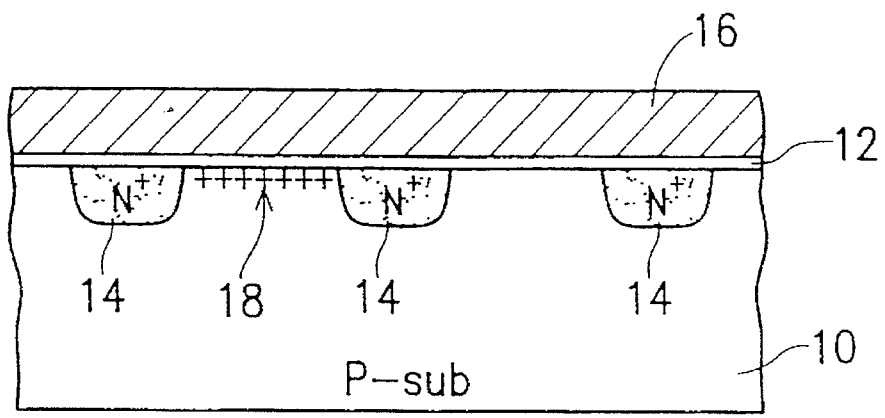
FIG. 2 (PRIOR ART) is a cross-sectional view of the memory cells of FIG. 1 (PRIOR ART) as taken along the II—II line thereof.
Figure 3:
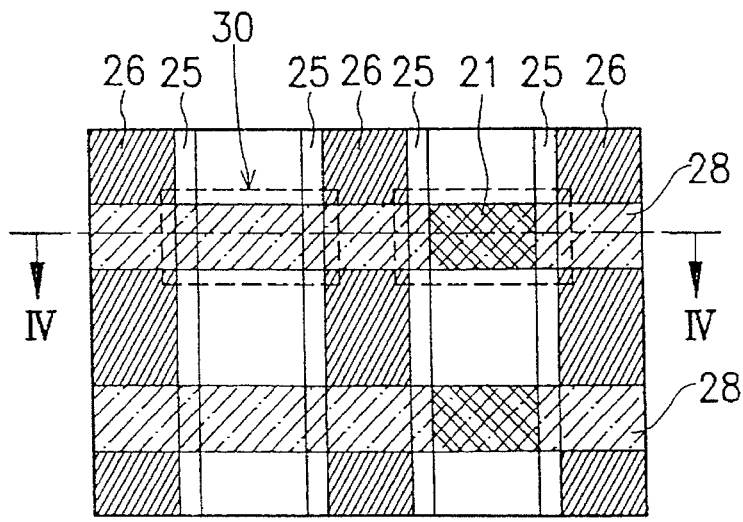
FIG. 3 is a top view of the ROM device fabricated in accordance with a preferred embodiment of the present invention showing the configuration of the memory cells.

Based on the requirement of the programmed content of the memory cells of the ROM device, some of the memory cells are covered by the first polysilicon layer 22 and the second polysilicon layers (word line 28) respectively, while others have the coding region 30 on the surface of the substrate 20 directly revealed, although still covered by the thick insulating layer 27 not shown in the top view of FIG. 3. Those memory cells with the polysilicon layers 22 and 28 on top allow their memory cell transistors to be turned on into the conduction state via the word lines 28 that are present.

Those memory cells not having the coverage of the polysilicon layers 22 and 28 do not have their memory cell transistors turned into their conduction state. The channel current thereof is blocked by the thick insulating layer 27, and they remain in the blocking state, that is, the OFF state all the time. With the selective ON and OFF status control of the memory cell transistors, the ROM device of the present invention may be "programmed" as is needed for different code/data requirements.

The semiconductor structural configuration of the memory cells for the ROM device of the present invention as depicted in the cross-sectional view of FIG. 4E, as well as in the top view of FIG. 3, may then be subjected to the steps that fabricate components such as metal conductors and passivation layers to conclude the fabrication of a complete ROM device. All these post processing steps which do not concern the scope of the present invention should be well known by persons skilled in this art, and will therefore not be described herein.

ROM device memory cells, constructed in accordance with the principles of the present invention, feature the titanium silicide layer 26 to reduce the electrical resistance in the buried bit lines 24, which results in the improvement in the operating speed of the memory cells. Because no ion implantation procedure is involved in the coding procedure, the conventional problems of programming implantation diffusion and mis-alignment, together with premature voltage breakdown are not experienced.

As persons skilled in this art may well appreciate, the above description of the preferred embodiment of the present invention is employed for the purposes of description, not to restrict the scope of the present invention. Modifications to the outlined embodiment of the present invention may be apparent and should be considered to be within the scope of the present invention that is recited in the claims that follow.

What is claimed is:

1. A process for fabricating memory cells of a read-only memory device comprising steps of:

forming a gate oxide layer, a first polysilicon layer, and a first silicide layer on a surface of a silicon substrate, and patterning the gate oxide layer, the first polysilicon layer and the first silicide layer to form parallel strip-shaped configurations extending along a first direction on the surface of said silicon substrate;

implanting impurities into said silicon substrate within areas between said parallel strip-shaped configurations, thereby constituting buried bit lines of said memory cells;

forming sidewall spacers on sidewalls of said parallel strip-shaped configurations;

forming a second silicide layer on a surface of said buried bit lines in a self-aligned process to improve electrical conductivity of said buried bit lines;

removing portions of said first silicide layer and said first polysilicon layer to form a coding region of said read-only memory device;

forming an insulating layer to fill said coding region and cover the surface of said silicon substrate;

polishing a surface of said insulating layer to an extent revealing a surface of said first polysilicon layer;

forming a second polysilicon layer on said silicon substrate covering the surface of said insulating layer and said first polysilicon layer; and etching said second polysilicon layer to form parallel strip-shaped word lines that extend in a second direction on a plane of said silicon substrate, said second direction being substantially orthogonal to said first direction, wherein portions of said first polysilicon layer not being covered by said word lines are also removed in said step of etching.

2. A process according to claim 1, wherein said first silicide layer is a tungsten silicide layer and said second silicide layer is a titanium silicide layer.

3. A process according to claim 2, wherein said buried bit lines are formed by implanting said impurities at an implantation energy level of about 50 to 100 KeV and a dosage of about $10^{14}$ to $10^{16}$ atoms/cm$^2$.

4. A process according to claim 2, wherein said sidewall spacers are made of silicon dioxide.

5. A process according to claim 2, wherein said self-aligned process of said step of forming said second silicide layer comprises steps of:

sputtering a titanium layer to a thickness of about 300 to 800 angstroms covering a surface of said tungsten silicide layer, said sidewall spacers and said buried bit lines;

performing an annealing process at a temperature of about 600° to 900° C., thereby causing a portion of said titanium layer over said buried bit lines to react with said buried bit lines to form said titanium silicide layer;

removing a remaining portion of said titanium layer which is not converted into said titanium silicide layer.

6. A process according to claim 2, wherein said insulating layer is a silicon dioxide layer having a thickness of greater than about 5,000 angstroms.

7. A process according to claim 2, wherein said step of polishing is a chemical mechanical polishing (CMP) procedure.

8. A process according to claim 2, wherein said second polysilicon layer has a thickness of about 2,000 to 5,000 angstroms.

9. A process according to claim 1, wherein said step of forming said gate oxide layer is a thermal oxidation procedure.

10. A process according to claim 1, wherein said step of forming said gate oxide layer is a chemical vapor deposition procedure.

11. A process according to claim 2, wherein said tungsten silicide layer has a thickness of about 500 to 1,000 angstroms.

12. A process according to claim 1, wherein said step of forming said sidewall spacers comprises:

depositing a silicon dioxide layer; and performing a reactive ion etching procedure to etch back said silicon dioxide layer.

13. A process according to claim 1, wherein said step of removing said portions of said first silicide layer and said first polysilicon layer comprises:

forming a photoresist layer on said surface of said silicon substrate, a coverage of a pattern of said photoresist layer revealing said coding region; and removing said first silicide layer and said first polysilicon layer by using said photoresist layer as a mask for an etching procedure.

14. A process according to claim 1, wherein said buried bit lines are formed by implanting said impurities at an implantation energy level of about 50 to 100 KeV and a dosage of about $10^{14}$ to $10^{16}$ atoms/cm$^2$.

15. A process according to claim 1, wherein said insulating layer is a silicon dioxide layer having a thickness of greater than about 5,000 angstroms.

16. A process according to claim 1, wherein said step of polishing is a chemical mechanical polishing (CMP) procedure.

17. A process according to claim 1, wherein said second polysilicon layer has a thickness of about 2,000 to 5,000 angstroms.

* * * * *